United States Patent
Oya

(10) Patent No.: US 6,469,393 B2
(45) Date of Patent: *Oct. 22, 2002

(54) SEMICONDUCTOR PACKAGE AND MOUNT BOARD

(75) Inventor: Yoichi Oya, Chiba (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/292,133

(22) Filed: Apr. 14, 1999

(65) Prior Publication Data

US 2001/0054753 A1 Dec. 27, 2001

(30) Foreign Application Priority Data

Apr. 16, 1998 (JP) .......................... 10-106424

(51) Int. Cl.⁷ ...................... H01L 23/492; H01L 23/488
(52) U.S. Cl. ........................ 257/779; 257/692; 257/693; 257/738; 257/780
(58) Field of Search ................................ 257/678, 687, 257/692, 693, 698, 730, 738, 779, 780

(56) References Cited

U.S. PATENT DOCUMENTS

| | | | |
|---|---|---|---|
| 5,462,837 A | | 10/1995 | Yamaguchi |
| 5,636,104 A | | 6/1997 | Oh |
| 5,726,501 A | * | 3/1998 | Matsubara ............... 257/778 |
| 5,844,782 A | | 12/1998 | Fukasawa |
| 5,973,931 A | * | 10/1999 | Fukasawa ............... 361/774 |
| 6,011,312 A | * | 1/2000 | Nakazawa et al. ........... 257/778 |
| 6,060,775 A | * | 5/2000 | Ano ............................ 257/693 |
| 6,084,300 A | * | 7/2000 | Oka ............................ 257/730 |

FOREIGN PATENT DOCUMENTS

| | | | |
|---|---|---|---|
| EP | 0 776 150 | | 5/1997 |
| JP | 11-121688 | * | 4/1999 |
| WO | WO 90 07792 | | 7/1990 |

OTHER PUBLICATIONS

Patent Abstracts of Japan vol. 1996, No. 11, Nov. 29, 1996 & JP 08 172143 A (Sony Corp), Jul. 2, 1996.

* cited by examiner

Primary Examiner—Allan R. Wilson
(74) Attorney, Agent, or Firm—Frommer Lawrence & Haug LLP; William S. Frommer; Matthew K. Ryan

(57) ABSTRACT

The package-side land 3a of a semiconductor package P1 is wholly exposed into the opening 5a of a solder resist layer 5. The board-side land 12a of the mount board B1 is also wholly exposed into the opening 13a of a solder resist layer 13. When the semiconductor package P1 and the mount board B1 are joined to each other through a soldering layer 14a, the soldering layer 14a is brought into contact to both the lands 3a and 12a while extending to the side wall surfaces thereof so that the joint strength can be enhanced by the increasing contact area and the shape. When the lands 3a and 12a are set to be equal to each other in dimension and shape, the soldering layer 14a is shaped into a pillar having a substantially uniform section, thereby preventing local concentration of stress. To ensure the joint strength based on a conductive material layer and enhance the mount reliability by making fine the terminals on a relay substrate which correspond to the input or output terminals of a semiconductor chip, and making the pitch narrow.

1 Claim, 4 Drawing Sheets

SEMICONDUCTOR PACKAGE AND MOUNT BOARD

FIELD OF THE INVENTION

The present invention relates to a semiconductor package and a mount board on which the semiconductor package is mounted, and a mounting method using the same, and particularly to a technique for enhancing mount reliability of a semiconductor package having mount terminals arranged at a minute pitch.

BACKGROUND OF THE INVENTION

In order to make a further development in miniaturization, high performance and multi-functionalization of electronic equipment it is an important factor how to increase the mount density of components on a mount board. With respect to the mount of semiconductor chips, there have been proposed various CSP (Chip Size Package or Chip Scale Package) to suppress the dimension of the outer shape of a package to the same level as the dimension of the body of the semiconductor chip by improving the internal structure of the package. No standardization has been established for CSP at present, however, it is a substantially common point that all input/output terminals are formed on an element-formed surface of a semiconductor chip and the arrangement of the input/output terminals is converted to another regular area arrangement through a relay board.

As CSP is typically known a BGA (Ball Grid Array) package in which terminals arranged on a relay board are metal balls such as soldering balls, Cu balls or the like.

In the BGA package p as shown in FIG. 1, a semiconductor chip 27 is mounted on a principal plane of a relay board 21 and further coated with a mold resin layer 30, and soldering balls 31 are regularly provided in an area arrangement on the other principal plane of the relay board 21.

A first conductive pattern 22 is beforehand formed on one principal plane of the relay board 21 in association with input/output terminals 28 of the semiconductor chip 27, and the semiconductor chip 27 is adhesively attached in a face-up style onto the relay board 21 through an insulating layer 26 of die bonding agent. The input/output terminals 28 of the semiconductor chip 27 and the first conductive pattern 22 are connected by bonding wires 29.

The first conductive pattern 22 is electrically connected through a penetrating via hole 24 to a second conductive pattern 23 on the other principal plane side. The second conductive pattern 23 is arranged in a grid shape over the entire surface or at the peripheral portion of the other principal plane of the relay board 21, and the soldering balls 31 are arranged on the second conductive pattern 28.

As described above, the linear arrangement of the input/output terminals 28 along the side of the rectangular semiconductor chip 27 is finally converted through the first conductive pattern 22, the penetrating via hole 24 and the second conductive pattern 23 to the grid arrangement of the soldering balls 31, that is, the ball grid array.

The mount board 41 on which the BGA package p is mounted is beforehand provided with lands 42 correspondingly to the arrangement of the soldering balls 31 on one principal plane. For example, preliminary solder is coated on the lands 42, and the soldering balls 31 of the BGA package p and the lands 42 of the mount board 41 are positioned to each other and joined to each other by a reflow soldering method or the like.

As shown in FIG. 1, the respective adjacent ones of the second conductive pattern 23 on the relay board and the respective adjacent ones of the lands 42 on the mount board 41 are mutually insulated from each other by the soldering resist layer 25 and 43 in order to avoid the adjacent ones from being short-circuited by bridges of solder.

The opening edges 25a and 43a of the soldering resist layers 25 and 43 are formed on the second conductive pattern 23 and the lands 42, respectively. That is, the respective opening areas of the soldering resist layers 25 and 43 are set to be smaller than the respective areas of the surfaces of the second conductive pattern 23 and the lands 42.

This is an idea to minimize the effect of dispersion of coplanarity (uniformity in height) of the soldering balls 31 on the mount reliability and to make the height of the balls uniform irrespective of presence or absence of a wire pattern at the periphery of lands.

Such the forming style of the lands and the solder resist layers as described above is hereinafter referred to as "throttle resist type".

If it is promoted in the future to further reduce the arrangement pitch of the soldering balls 31, however, in order to suppress the enlargement of the BGA package p due to increase of the number of the terminals of the semiconductor chip 27, the dimension of the second conductive pattern 23 and the soldering balls 31 themselves must be reduced so that the joint area between the second conductive pattern 23 and the soldering balls 31 is reduced. When such a BGA package p is mounted on the mount board and a predetermined temperature cycle test is performed, stress due to thermal deformation of the mount board 41 is concentrated onto the interface between the second conductive pattern 23 and the soldering balls 31, and the occurrence frequency of cracks (cracks) at this portion rises up. In addition, as the arrangement pitch of the soldering balls 31 is reduced, the risk that cracks occur in a large number of soldering balls 31 at the same time is increased.

SUMMARY OF THE INVENTION

It is an object of the present invention to provide a semiconductor package and a mount board which can beforehand prevent the above disadvantage and enhance the mount reliability and a mounting method using the same.

As a result of repeated considerations to attain the above object, the inventor has found out that if lands are wholly exposed from a solder resist layer at least at one of a semiconductor package side and a mount board side to thereby enable a conductive material layer formed of soldering or the like to extend to the side wall surfaces of the lands, the joint strength between the conductive material layer and the lands can be improved by the increasing contact area between the conductive material layer and the lands and a shape of the conductive material layer.

In the semiconductor package of the present invention, a land of the package-side is wholly exposed in an opening of a solder resist layer having an opening area larger than the area of the surface of the land.

Further, in the mount board of the present invention, a land of the board-side is wholly exposed in an opening of a solder resist layer having an opening area larger than the area of the surface of the land.

Further, in the mounting method of the present invention, at least one of a package-side land and a board-side land is wholly exposed in an opening of a solder resist layer having an opening area larger than the area of the surface thereof, and the package-side land and the board-side land are electrically connected to each other through a conductive material layer.

DESCRIPTION OF THE PREFERRED EMBODIMENTS

Figure 1:
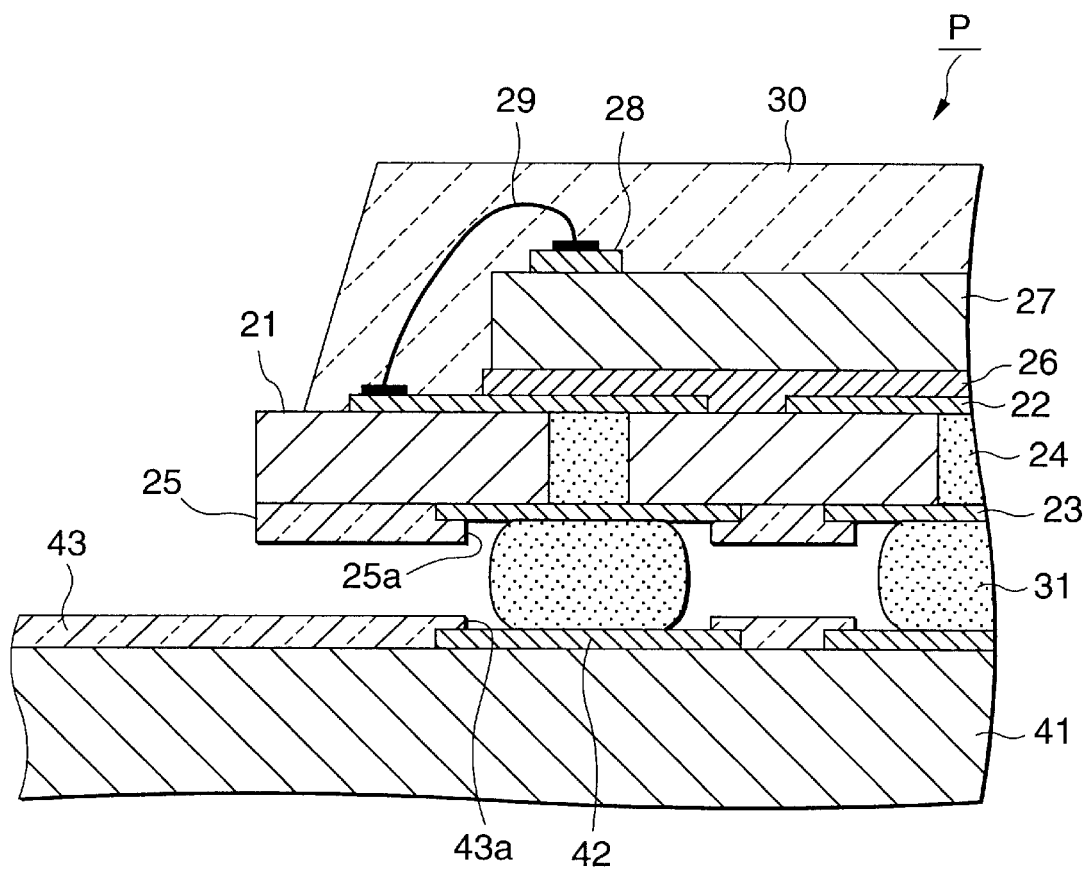
FIG. 1 is a schematic cross-sectional view showing a conventional BGA package mounted on a mount board.

In the semiconductor package of the present invention, package-side lands arranged on a relay board are wholly exposed from a solder resist layer. Accordingly, the conductive material layer can extend to the side wall surfaces of the package-side lands when it is mounted on a mount board. As a result, the joint strength can be improved by by the increasing contact area between the conductive material layer and the lands and a shape of the conductive material layer, thereby enhancing the mount reliability. Such the forming style of the lands and the solder resist layer as described above is hereinafter referred to as "over resist type".

When the above package-side lands are directly mounted through a thin conductive material layer, the semiconductor package of the present invention is made as a so-called LGA (Land Grid Array) package, and this is the most preferable embodiment. This is because the LGA package has a higher probability that the dimension and the arrangement pitch of the package-side lands is reduced as compared with the BGA package, and the improving effect of the joint strength as described above is relatively enhanced.

However, the semiconductor package of the present invention can be made as a BGA package. In this case, soldering balls are formed so as to cover all of the upper surfaces and the side wall surfaces of the package-side lands.

Further, in the mount board of the present invention, by setting the board-side lands and the soldering resist layer to the over resist type, the conductive material layer extends to the side wall surfaces of the board-side lands to enhance the joint strength as in the case of the package-side lands as described above.

If the dimension and shape of the board-side lands are substantially equal to those of the package-side lands, the improving effect of the joint strength can be further enhanced. This is because the profile of the conductive material layer in a condition that the semiconductor package is mounted on the mount board is a pillar shape having an uniform section and thus the concentration of the stress to a specific point can be prevented. If the board-side lands and the package-side lands are extremely different in dimension, the profile of the conductive material layer is conical and thus the stress is concentrated to a portion having a small area, so that there is a large risk that cracks occur.

In the mounting method of the present invention, at least one of the semiconductor package and the mount board is designed in an over resist type, and both the lands are electrically connected to each other through the conductive material layer. By designing only one of the semiconductor package and the mount board in the over resist type, the mount reliability can be more greatly enhanced as compared with the case where both are designed in the throttle resist type. However, if both are designed in the over resist type, the maximum improving effect can be obtained.

As the conductive material layer may be used publicknown material such as solder, conductive adhesive agent, anisotropic conductive film or the like.

More detailed embodiments of the present invention will be hereunder described.

First Embodiment

A construction of a semiconductor package of an over-resist type will be described with reference to FIG. 2.

A semiconductor package P1 is a so-called LGA package in which a semiconductor chip 7 is mounted on a principal plane of a relay board 1 formed of glass-epoxy composite material and further coated with a mold resin layer 10, and package-side lands 3a are regularly provided in an area arrangement on the other principal plane.

A conductive pattern 2 is beforehand formed on one principal plane of the relay board 1 in association with input/output terminals 8 of a semiconductor chip 7, and the semiconductor chip 7 is adhesively attached in a face-up style onto the relay board 1 through an insulating layer 6 of die bonding agent. The input/output terminals 8 of the semiconductor chip 7 are connected to the conductive pattern 2 by using bonding wires 9.

The conductive pattern 2 is guided through a penetrating bear hole 4 to the other principal plane side, and connected to the package-side lands 3a. The package-side lands 3a are formed by patterning copper foil of 10 to 20 $\mu$m in thickness, and arranged in a grid shape on the whole surface of the other principal plane of the relay board 1. The package side lands 3a are arranged, for example, circular package side lands 3a of 15×15, 45 $\mu$m in diameter and pitch=0.8 mm are arranged in a full matrix shape.

Each individual package side land 3a is wholly exposed in the opening 5a of the solder resist layer 5 as the over resist type. The opening 5a is set to be circular in 65 $\mu$mm diameter and depth=20 to 50 $\mu$m, for instance.

Second Embodiment

Here, a construction of a mount board of an over resist type will be described with reference to FIG. 3.

In a mount board B1, board-side lands 12a are formed at a area where a semiconductor package is to be mounted on one principal plane of a base 11 formed of ceramic correspondingly to the arrangement of the package-side lands of the semiconductor package. The board-side lands 12a are formed by patterning copper foil of 10 to 20 $\mu$m thickness, and arranged in a grid shape at the area of the base 11 where the semiconductor package is to be mounted. In this case, if the semiconductor package P1 shown in FIG. 1 is mounted, the dimension, the shape and the number of the board-side lands 12a are set to the same as the package-side lands 3a described above.

Each of the board-side lands 12a is wholly exposed in the opening 13a of the solder resist layer 13 as the over resist type. The shape and dimension of the opening 13a are set to the same as the opening 5a of the package side.

Third Embodiment

In this case, a method of mounting the above semiconductor package P1 on the mount board B1 will be described with reference to FIGS. 4 and 5.

Figure 2:
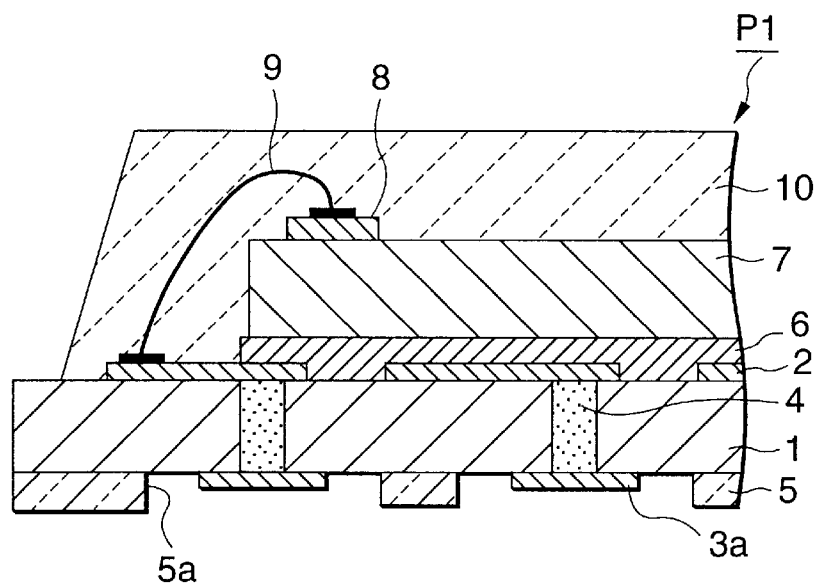
FIG. 2 is a schematic cross-sectional view showing a construction of a semiconductor package of the present invention.
Figure 3:
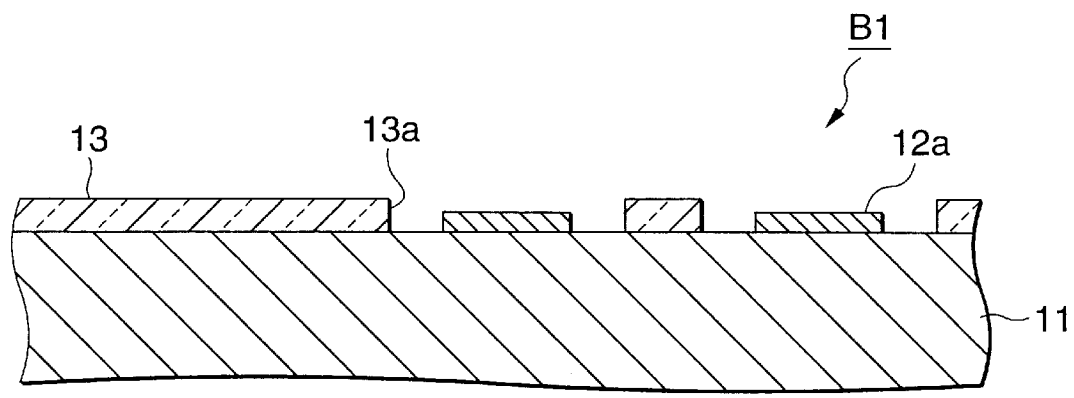
FIG. 3 is a schematic cross-sectional view showing a construction of a mount board of the present invention.
Figure 4:
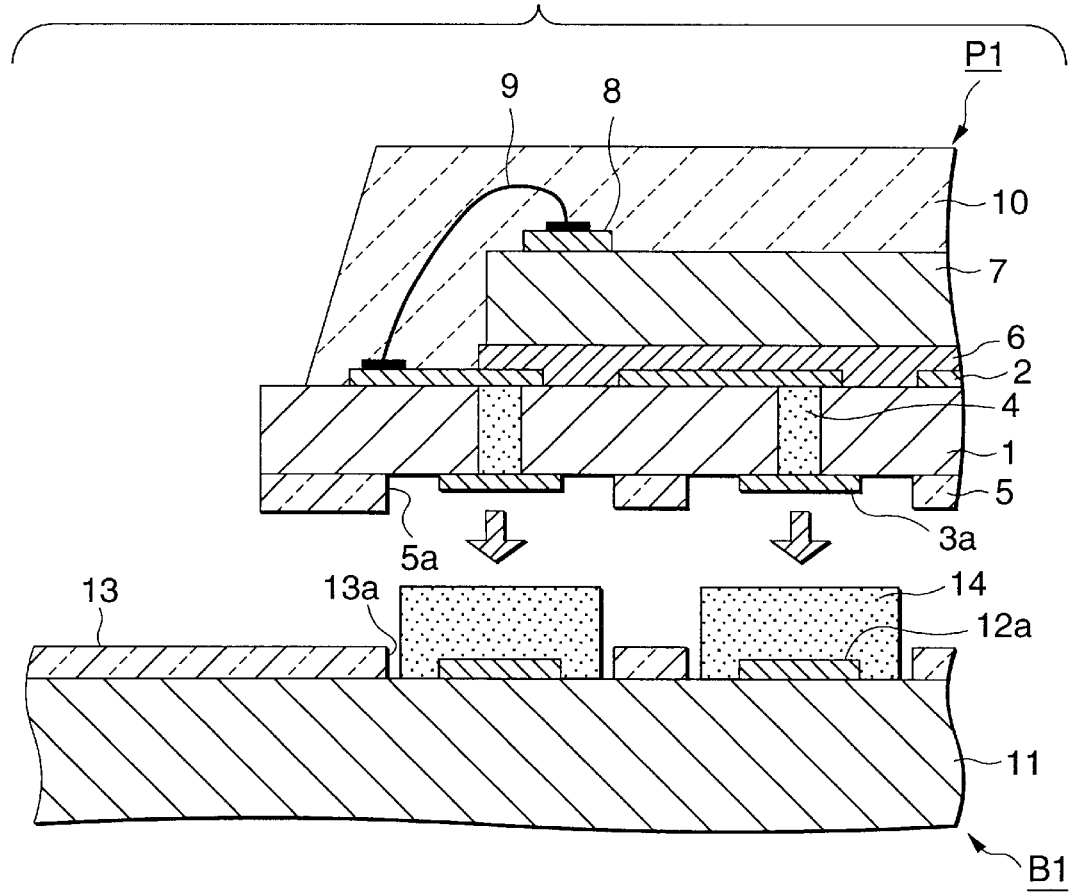
FIG. 4 is a schematic cross-sectional view showing a state that the semiconductor package is positioned to the mount board in the present invention.

FIG. 4 shows a state that the semiconductor package P1 shown in FIG. 2 and the mount board B1 shown in FIG. 3 are positioned to each other. Here, a soldering layer 14 is deposited and formed on the board-side lands 12a of the mount board B1 by coating soldering paste on screen print.

Figure 5:
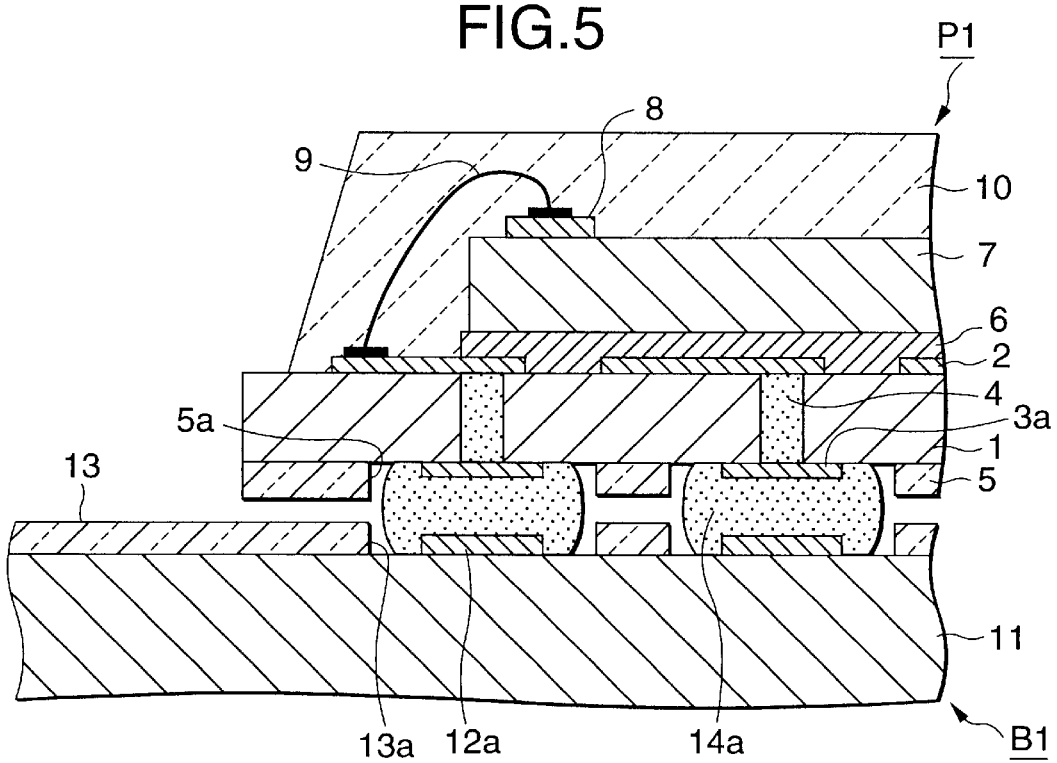
FIG. 5 is a schematic cross-sectional view showing a state that the semiconductor package of the present invention is mounted on the mount board of the present invention.

FIG. 5 shows a state that the semiconductor package P1 and the mount board B1 are overlapped with each other in the direction as indicated by an arrow in FIG. 4 and subjected to reflow soldering. As shown in FIG. 5, the soldering layer 14a adheres to both the package-side land 3a and the board-side land 12a while extending to the side wall surfaces thereof. In addition, both the lands 3a and 12a are equal to each other in shape and dimension, so that the profile of the soldering layer 14a thus formed is substantially uniform in section, and local stress concentration can be prevented.

Fourth Embodiment

In the third embodiment, both of the semiconductor package and the mount board are of the over resist type. In this case, however, it will be described with reference to FIG. 6 that only the semiconductor package is of the over resist type and the mount board is a conventional throttle resist type.

Figure 6:
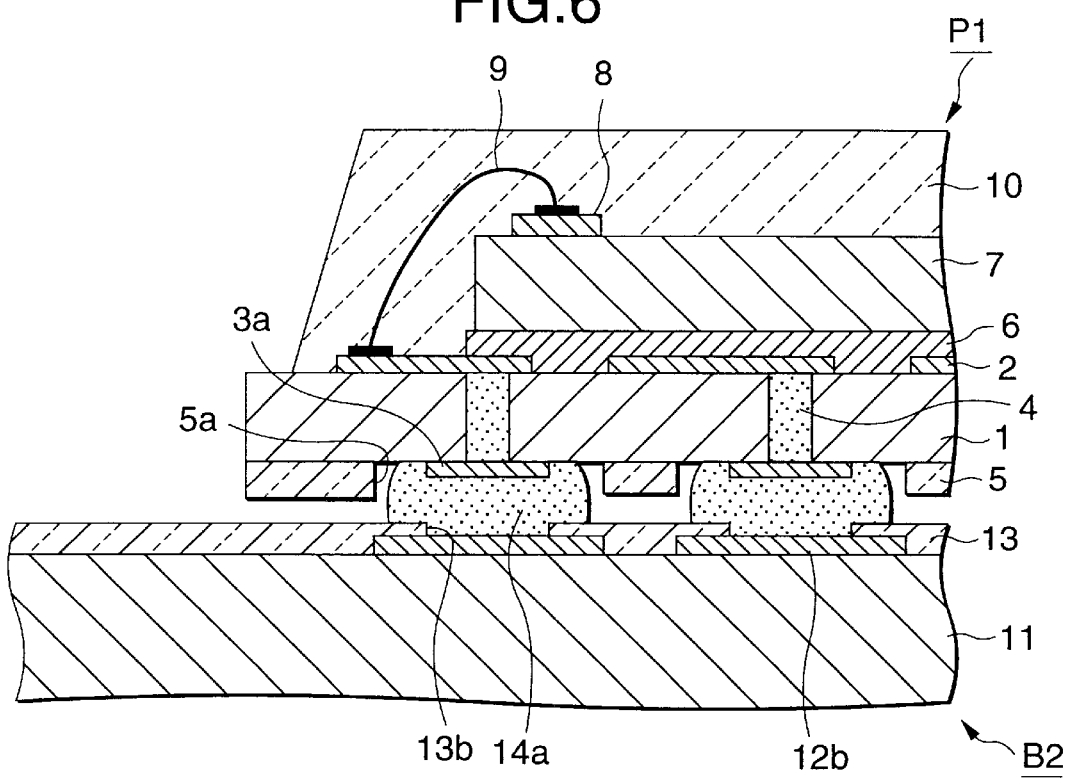
FIG. 6 is a schematic cross-sectional view showing a state that the semiconductor package designed in "over resist type" is mounted on the mount board designed in "throttle resist type".

In a mount board B2 of FIG. 6, the solder resist layer 13 is coated on the edges of the board-side land 12b, and the board-side land 12b is exposed to the inside of the opening 13b. The size relationship between the board-side land 12b and the opening 13b is opposite to that in the mount board B1 described above. That is, the board-side land 12b is designed in a circular shape of 65 μm in diameter, the opening 13b is designed in a circular shape of 45 μm in diameter.

When the semiconductor package P1 is mounted on the mount board B2, while the soldering layer 14a is joined to the package side lands 3a extending to the side wall surfaces thereof as shown in FIG. 6, it is joined on only the upper surfaces of the board-side lands 12b.

Fifth Embodiment

In this case, it will be described with reference to FIG. 7 that only the mount board is the over resist type and a semiconductor package of a conventional throttle resist type is used oppositely to the fourth embodiment.

Figure 7:
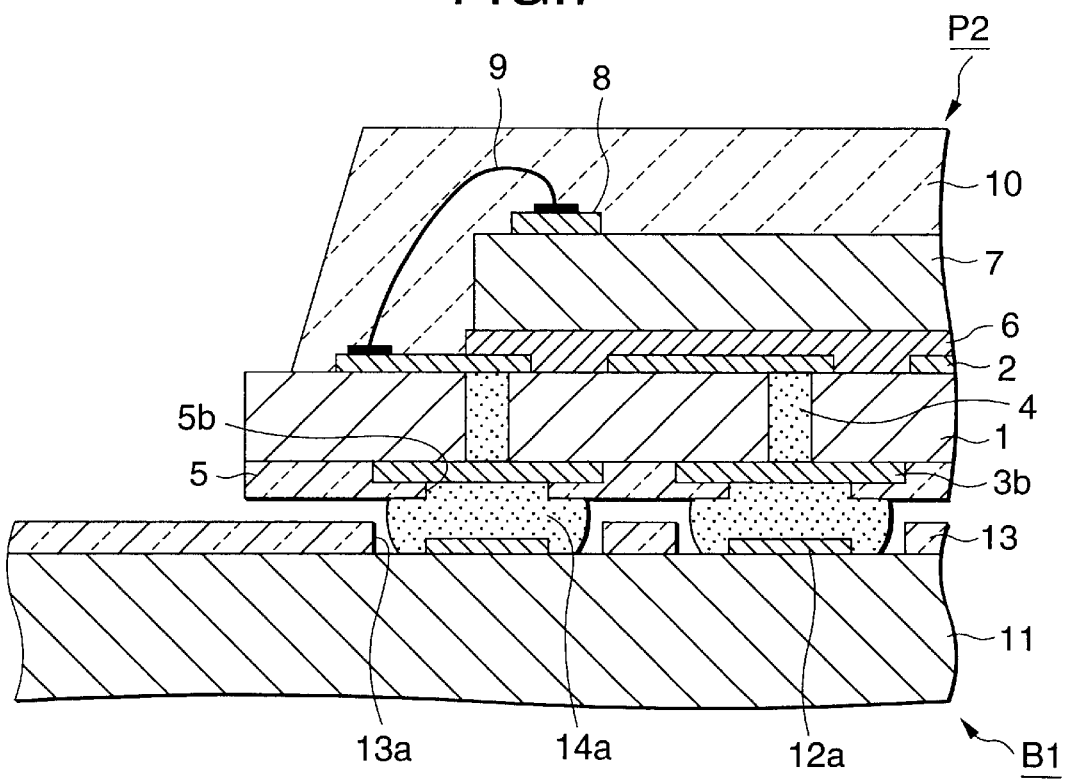
FIG. 7 is a schematic cross-sectional view showing a state that the semiconductor package designed in "throttle resist type" on the mount board designed in "over resist type".

In a semiconductor package P2 shown in FIG. 7, a solder resist layer 5 covers the edges of package-side lands 3b, and the package-side land 3b is exposed to the inside of an opening 5b. The size relationship between the package-side land 3b and the opening 5b is opposite to that in the semiconductor package P1 described above. That is, the package-side land 3b is designed in a circular shape of 65 μm in diameter, and the opening 5b is designed in a circular shape of 45 μm in diameter.

When the semiconductor package P2 described above is mounted on the mount board B3, while a solder layer 14a is joined to the board-side land 12a extending to the side wall surface thereof, it is joined on only the upper surface of the package-side land 3b.

Here, a thermal cycle test of −25° C. to +125° C. was carried out for each mount article obtained in the third to fifth embodiments and a cycle frequency until crack occurred at the soldering joint portion was examined.

As comparative examples, the same thermal cycle test was carried out for a mount article in which both the semiconductor package and the mount board were designed in the throttle resist type. This mount article was obtained by mounting the semiconductor package P2 shown in FIG. 7 on the mount board B2 shown in FIG. 6. The result is shown in Table 1.

TABLE 1

| Semiconductor Package | Mount Board | |
|---|---|---|
| | Over Resist Type B1 | Throttle Resist Type B2 |
| Over Resist Type P1 | >1000 cycles (Third embodiment) | >500 cycles (Fourth embodiment) |
| Throttle Resist Type P2 | >500 cycles (Fifth embodiment) | <250 cycles (Comparative example) |

In the case of the conventional mount article in which both the semiconductor package and the mount board are designed in the throttle resist type, the area of the soldering joint portion is limited to a small value, and thus crack occurred within 250 cycles.

On the other hand, in the case that either the semiconductor package or the mount board is designed in the over resist type, the cycle lifetime is substantially doubled. Further, in the case that both are designed in the over resist type, the cycle lifetime is increased four times. Accordingly, the mount reliability in the over resist type was confirmed.

Although the five embodiments of the present invention have been described above, the present invention is not limited to these embodiments. For example, with respect to the mount style of the semiconductor chip on the relay board, it is described in the above that the semiconductor chip which is adhesively attached in the face-up style is connected to the conductive pattern by the wire bonding. However, the semiconductor chip may be mounted in a face-down style by using leads or soldering balls. Besides, suitable modifications, selections and combinations may be made on the dimension and shape of the lands, the arrangement of the lands at the semiconductor package side or the mount board side and the details of the constituent materials of the respective parts, etc.

What is claimed is:

1. A semiconductor package and mount board comprising:
a semiconductor chip having input or output terminals;
a relay board having:
    package side lands having a defined surface area and side walls and being arranged on a principal plane thereof in association with said respective input or output terminals of said semiconductor chip; and
    a first solder resist layer mutually insulating said package side lands and having openings having a larger area than the surface area of said package side lands so that a gap exist between the first solder resist layer and said package side lands;
a base member;
board side lands having a defined surface area and side walls and being disposed on one principal plane of said base member in the same arrangement of said package side lands which are to be mounted thereon through a soldering layer which adheres only to the complementary package side lands and board side lands which complement each other when the relay board is mounted over the base member and the soldering layer extends to the side walls thereof;

a second solder resist layer mutually insulating said board side lands and having openings having a larger area than the surface area of said board side lands so that a gap exists between the second solder resist layer and said board side lands wherein the gaps respectively between the first solder resist layer and the package side lands and the second solder resist layer and the board side lands have the same dimension and whereby each soldering layer between the complementary package and board side lands does not extend to said first and second solder resist layers; and wherein said complementary package side lands and said board side lands are equal to each other in shape and dimension so that the soldering layers between the complementary package and board side lands are substantially uniform in profile and the first and second solder resist layers are respectively provided between each pair of adjacent package and board side lands but do not overlap the adjacent package and board side lands.

* * * * *